(12) United States Patent
Gregoire et al.

(10) Patent No.: US 9,379,448 B2
(45) Date of Patent: Jun. 28, 2016

(54) POLARIZATION INDEPENDENT ACTIVE ARTIFICIAL MAGNETIC CONDUCTOR

(71) Applicant: HRL LABORATORIES, LLC., Malibu, CA (US)

(72) Inventors: Daniel J. Gregoire, Thousand Oaks, CA (US); Carson R. White, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 193 days.

(21) Appl. No.: 14/188,225

(22) Filed: Feb. 24, 2014

(65) Prior Publication Data

US 2015/0244080 A1    Aug. 27, 2015

(51) Int. Cl.
| | |
|---|---|
| *H01Q 15/14* | (2006.01) |
| *H05K 1/16* | (2006.01) |
| *H01Q 15/00* | (2006.01) |

(52) U.S. Cl.
CPC ............. *H01Q 15/14* (2013.01); *H01Q 15/002* (2013.01); *H01Q 15/008* (2013.01); *H01Q 15/0066* (2013.01); *H01Q 15/141* (2013.01); *H01Q 15/142* (2013.01); *H01Q 15/148* (2013.01); *H05K 1/165* (2013.01); *H05K 2203/162* (2013.01); *Y10T 29/49016* (2015.01)

(58) Field of Classification Search
CPC ... H01Q 15/14; H01Q 15/141; H01Q 15/142; H01Q 15/0066; H01Q 15/002; H01Q 15/008; H01Q 15/148; H05K 1/165; H05K 2203/162; Y10T 29/49016
USPC .................................. 343/909, 846, 848, 913
See application file for complete search history.

(56) References Cited

U.S. PATENT DOCUMENTS

| | | | |
|---|---|---|---|
| 4,234,960 | A | 11/1980 | Spilsbury |
| 4,904,952 | A | 2/1990 | Tanimoto |
| 5,392,002 | A | 2/1995 | Delano |
| 5,489,878 | A | 2/1996 | Gilbert |
| 6,081,167 | A | 6/2000 | Kromat |
| 6,121,940 | A | 9/2000 | Skahill et al. |
| 6,411,261 | B1 * | 6/2002 | Lilly .................... H01Q 15/008 342/5 |
| 6,476,771 | B1 | 11/2002 | McKinzie |
| 6,483,480 | B1 | 11/2002 | Sievenpiper et al. |
| 6,509,875 | B1 | 1/2003 | Nair et al. |

(Continued)

FOREIGN PATENT DOCUMENTS

| | | |
|---|---|---|
| CN | 101853974 A | 10/2010 |
| CN | 102005648 A | 4/2011 |

(Continued)

OTHER PUBLICATIONS

From U.S. Appl. No. 13/472,396 (now U. S. Publication No. 2013-0009722 A1), Final Office Action mailed on Apr. 9, 2015.

(Continued)

*Primary Examiner* — Khai M Nguyen
(74) *Attorney, Agent, or Firm* — Ladas & Parry

(57) ABSTRACT

An active artificial magnetic conductor includes a ground plane and an array of unit cells coupled to the ground plane. Each unit cell includes a low impedance shunt coupled to the ground plane and an impedance element coupled to the low impedance shunt. A plurality of non Foster circuits are coupled in two different directions between impedance elements of adjacent neighboring unit cells in the array of unit cells.

23 Claims, 8 Drawing Sheets

(56) References Cited

U.S. PATENT DOCUMENTS

| | | | |
|---|---|---|---|
| 6,518,930 | B2 | 2/2003 | Itoh et al. |
| 6,525,695 | B2* | 2/2003 | McKinzie, III .......... H01Q 3/46 343/756 |
| 6,538,621 | B1* | 3/2003 | Sievenpiper .......... H01Q 9/0442 343/700 MS |
| 6,768,472 | B2 | 7/2004 | Alexopoulos et al. |
| 6,917,343 | B2* | 7/2005 | Sanchez .................. H01Q 3/44 343/795 |
| 6,952,565 | B1 | 10/2005 | Takeda |
| 7,042,419 | B2 | 5/2006 | Werner et al. |
| 7,245,269 | B2* | 7/2007 | Sievenpiper .......... H01Q 19/104 343/700 MS |
| 7,388,186 | B2 | 6/2008 | Berg et al. |
| 7,586,384 | B2 | 9/2009 | Ranta |
| 7,619,568 | B2 | 11/2009 | Gillette |
| 7,847,633 | B2 | 12/2010 | Kinget |
| 7,852,174 | B2 | 12/2010 | Cathelin |
| 7,880,568 | B2 | 2/2011 | Amin et al. |
| 8,111,111 | B2 | 2/2012 | Van Bezooijen |
| 8,263,939 | B2 | 9/2012 | Delaney et al. |
| 8,358,989 | B2 | 1/2013 | Kakuya et al. |
| 8,374,561 | B1 | 2/2013 | Yung |
| 8,436,785 | B1 | 5/2013 | Lai et al. |
| 8,451,189 | B1 | 5/2013 | Fluhler |
| 8,639,203 | B2 | 1/2014 | Robert et al. |
| 8,957,831 | B1* | 2/2015 | Gregoire .............. H01Q 15/004 343/700 MS |
| 8,959,831 | B2 | 2/2015 | Smith |
| 9,093,753 | B2* | 7/2015 | Jung .................... H01Q 15/008 |
| 2002/0041205 | A1 | 4/2002 | Oppelt |
| 2002/0167457 | A1* | 11/2002 | McKinzie, III .......... H01Q 3/46 343/909 |
| 2004/0056814 | A1 | 3/2004 | Park et al. |
| 2004/0227668 | A1 | 11/2004 | Sievenpiper |
| 2004/0263420 | A1 | 12/2004 | Werner et al. |
| 2005/0184922 | A1 | 8/2005 | Ida et al. |
| 2007/0182639 | A1 | 8/2007 | Sievenpiper et al. |
| 2008/0088390 | A1 | 4/2008 | Cathelin |
| 2008/0094300 | A1 | 4/2008 | Lee |
| 2008/0164955 | A1 | 7/2008 | Pfeiffer |
| 2008/0242237 | A1 | 10/2008 | Rofougaran et al. |
| 2008/0284674 | A1 | 11/2008 | Herz et al. |
| 2009/0025973 | A1 | 1/2009 | Kazantsev et al. |
| 2010/0039111 | A1 | 2/2010 | Luekeke et al. |
| 2010/0039343 | A1 | 2/2010 | Uno et al. |
| 2010/0149430 | A1 | 6/2010 | Fulga |
| 2010/0225395 | A1 | 9/2010 | Patterson |
| 2010/0231470 | A1 | 9/2010 | Lee et al. |
| 2010/0238085 | A1 | 9/2010 | Fuh et al. |
| 2011/0018649 | A1 | 1/2011 | David et al. |
| 2012/0256709 | A1 | 10/2012 | Hitko et al. |
| 2012/0256811 | A1* | 10/2012 | Colburn .............. H01Q 15/148 343/907 |
| 2013/0009720 | A1 | 1/2013 | White et al. |
| 2013/0009722 | A1 | 1/2013 | White et al. |
| 2013/0200947 | A1 | 8/2013 | Alexopoulos et al. |

FOREIGN PATENT DOCUMENTS

| | | |
|---|---|---|
| EP | 0295704 A2 | 12/1988 |
| EP | 2 290 745 A1 | 3/2011 |
| GB | 2288502 A | 10/1995 |
| JP | 2008 278159 A | 11/2008 |
| TW | 200845482 | 11/2008 |
| WO | 2006/054246 | 5/2006 |
| WO | 2009/090244 A1 | 7/2009 |

OTHER PUBLICATIONS

EPO Extended Search Report with Search Opinion dated Mar. 19, 2015 from European Patent Application No. 12806913.5.

Mirzaei, H, et al.: "A wideband metamaterial-inspired compact antenna using embedded non-Foster matching," Antennas and Propagation (APSURSI), 2011 IEEE International Symposium on, IEEE. Jul. 3, 2011, pp. 1950-1953.

From U.S. Appl. No. 13/910,039 (unpublished, non publication requested), Office Action mailed on Jun. 15, 2015.

Office Action dated Jun. 8, 2015 from Chinese Patent Application No. 201280033448.2 with machine English translation.

Pozar, David M., *Microwave Engineering*, Second Edition, John Wiley & Sons, Inc., 1998, pp. 89-90 and 629-631 with table of contents (16 pages).

Sandel, B., Radio Frequency Amplifiers, A.S.T.C., Chapter 23, pp. 912-946, 1960.

Office Action dated Jul. 22, 2015 from Chinese Patent Application No. 201280021746.X with brief English summary.

From U.S. Appl. No. 13/472,396, Office Action mailed on Sep. 11, 2015.

U.S. Appl. No. 13/910,039, filed Jun. 4, 2013, Gregoire.

From U.S. Appl. No. 13/472,396 (Now Published as US 2013-0009722 A1), Non Final Rejection dated Sep. 11, 2015.

From Chinese Patent Application No. 201280021449.5, PRC Office Action dated Sep. 29, 2015 with a brief English summary.

U.S. Appl. No. 12/768,563, filed Apr. 27, 2010, Michael W. Yung.

U.S. Appl. No. 13/441,730, filed Apr. 6, 2012, Hitko et al.

D. Sievenpiper, L. Zhang, R. Broas, N. Alexopolous, and E. Yablonovitch, "High-impedance electromagnetic surfaces with a forbidden frequency band," IEEE Trans. Microwave Theory Tech., vol. 47, pp. 2059-2074, Nov. 1999.

F. Costa, S. Genovesi, and A. Monorchio, "On the bandwidth of high-impedance frequency selective surfaces", IEEE AWPL, vol. 8, pp. 1341-1344, 2009.

White, C. R.; May, J. W.; Colburn, J. S.; , "A variable negative-inductance integrated circuit at UHF frequencies," Microwave and Wireless Components Letters, IEEE , vol. 22, No. 1, 35-37, 2012.

O. Luukkonen et al, "Simple and accurate analytical model of planar grids and high-impedance surfaces", IEEE Trans. Antennas Propagation, vol. 56, 1624, 2008.

R. M. Foster., "A reactance theorem", Bell Systems Technical Journal, vol. 3, pp. 259-267, 1924.

Gregoire, D. J.; Colburn, J. S.; White, C. R.; , "A coaxial TEM cell for direct measurement of UHF artificial magnetic conductors", IEEE Antenna and Propagation Magazine, 54, 251-290, 2012.

S. Stearns, "Non-Foster circuits and stability theory," *Proc. IEEE Ant. Prop. Int. Symp.*, 2011, pp. 1942-1945.

S. E. Sussman-Fort and R. M. Rudish, "Non-Foster impedance matching of electrically-small antennas," IEEE Trans. Antennas Propagation, vol. 57, No. 8, Aug. 2009.

C. R. White and G. M. Rebeiz, "A shallow varactor-tuned cavity-backed-slot antenna with a 1.9:1 tuning range," IEEE Trans. Antennas Propagation, 58(3), 633-639, Mar. 2010.

International Search Report and Written Opinion for PCT/US/2012/032638 mailed on Oct. 29, 2012.

International Search Report and Written Opinion for PCT/US2012/032648 mailed on Dec. 14, 2012.

U.S. Appl. No. 14/188,264, filed Feb. 24, 2014, White et al.

International Preliminary Report on Patentability for PCT/US2012/045632 mailed on Jul. 10, 2013.

International Preliminary Report on Patentability for PCT/US2012/32638 mailed on Jun. 27, 2013.

International Search Report and Written Opinion for PCT/US2012/045632 mailed on Jan. 10, 2013.

International Preliminary Report on Patentability for PCT/US2012/032648 mailed on Oct. 17, 2013.

From U.S. Appl. No. 12/768,563 (now U.S. Pat. No. 8,374,561), Notice of Allowance mailed on Oct. 23, 2012.

From U.S. Appl. No. 12/768,563 (now U.S. Pat. No. 8,374,561), Non-Final Office Action mailed on Jun. 13, 2012.

Slideshow for "Matching Network Design Using Non-Foster Impedances" by Stephen E. Sussman-Fort, Ph.D. of EDO Corporation (printed from the Internet on Jun. 30, 2011) (43 pages).

Cyril Svetoslavov Mechkov, "A heuristic approach to teaching negative resistance phenomenon," *Third International Conference—Computer Science '06*, Istanbul, Turkey, Oct. 12-15, 2006 (6 pgs).

(56) References Cited

OTHER PUBLICATIONS

White Paper by the Virginia Tech Antenna Group of Wireless @ Virgina Tech "Non-Foster Reactance Matching for Antennas," pp. 1-5 <http://wireless.vt.edu/research/Antennas_Propagation/Whitepapers/Whitepaper-Non-Foster_Reactance_Matching_for_Antennas.pdf>.
Stephen E. Sussman-Fort, "Gyrator-Based Biquad Filters and Negative Impedance Converters for Microwaves," *International Journal of RF and Microwave Computer-Aided Engineering*, vol. 8, No. 2, pp. 86-101, 1998.
Stephen E. Sussman-Fort, "Matching Network Design Using Non-Foster Impedances," *International Journal of RF and Microwave Computer-Aided Engineering*, vol. 16, Issue 2, pp. 135-142, Feb. 2006.
S.E. Sussman and R.M. Rudish, "Non-Foster Impedance matching for transmit applications," *IEEE Xplore*, EDO Corporation and Dept. of Electrical and Computer Engineering. pp. 53-56, Mar. 6-8, 2006.
S.E. Sussman-Fort and R.M. Rudish. EDO Corporation, "Increasing efficiency or bandwidth of electrically small transmit antennas by impedance matching with non-foster circuits", Progress in Electromagnetics Research Symposium 2006, Cambridge, USA, Mar. 26-29, 2006.
S.E. Sussman-Fort, "Matching network design using non-foster impedances," *International Journal of RF and Microwave Computer-Aided Engineering*, 16(2), pp. 135-142, Feb. 2006.
Bezooijen, et al. "RF-MEMS based adaptive antenna matching module," IEEE Radio Frequency Integrated Circuits Symposium, p. 573-576, 2007.
J.G. Linvill, "Transistor negative-impedance converters", *Proceedings of the IRE*, vol. 41, pp. 725-729, Jun. 1953.
R.L. Brennan, et al., "The CMOS negative impedance converter", *IEEE Journal of Solid-State Circuits*, 32(5), Oct. 1988.
C.R. White, J.W. May and J.S. Colburn, "A Variable negative-inductance integrated circuit at UHF frequencies", *IEEE MWCL*, 22(1), Jan. 2012.
B. H. Fong, et al., "Scalar and tensor holographic artificial impedance surfaces", *Trans. Antennas and Propag.*, vol. 58, pp. 3212-3221, Oct. 2010.
J.S. Colburn, et al., "Adaptive Artificial Impedance Surface Conformal Antennas", *Proc. IEEE Antennas and Propagation Society Int. Symp.*, 2009, pp. 1-4.
D.J. Kern, D.H. Werner and M. J. Wilhelm, "Active negative impedance loaded EBG structures for the realization of ultra-wideband artificial magnetic conductor", *Proc. IEEE Antennas and Propagation Society Int. Symp.*, 2003, pp. 427-430.
K. Song and R.G. Rojas, "Non-foster impedance matching of electrically small antennas, "*Proc. IEEE Ant. Prop. Int. Symp.*, Jul. 2010.
D.J. Gregoire, C.R. White, and J.S. Colburn, "Non-foster metamaterials", *Antenna Applications Symposium 2011*, Sep. 2011.
EPO Supplementary European Search Report with European Search Opinion dated Oct. 8, 2014 from European Patent Application No. 12768357.1.
Chen, Ying et al., "Wideband Varactorless LC VCO Using a Tunable Negative-Inductance Cell" , IEEE Transactions on Circuits and Systems, I: Regular Papers, IEEE, US, vol. 57, No. 10, Oct. 1, 2010, pp. 2609-2617 and II. A Principle of Tunable NI Cell, p. 2609.
Ramirez-Angulo, J. et al.: "Simple technique using local CMFB to enhance slew rate and bandwidth of one-stage CMOS op-amps", Electronics Letters, IEE Stevenage, GB, vol. 38, No. 23, Nov. 7, 2002, pp. 1409-1411.
Chinese Office Action dated Oct. 27, 2014 from Chinese Patent Application No. 2012800334482 with English translation.
Staple, et al. "The End of Spectrum Scarcity," published by IEEE Spectrum, Mar. 2004, pp. 1-5.
EPO Supplementary European Search Report with European Search Opinion dated Jul. 29, 2014 from European Patent Application No. 12767559.3.
Hrabar S., et al., "Towards active dispersion less ENZ metamaterial for cloaking applications", Metamaterials, Elsevier BV, NL, vol. 4, No. 2-3, Aug. 1, 2010, pp. 89-97.
Gregoire, Daniel J., et al., "Wideband Artificial Magnetic Conductors Loaded With Non-Foster Negative Inductors", IEEE Antennas and Wireless Propagation Letters, IEEE, Piscataway, NJ, US, vol. 10, Dec. 26, 2011, pp. 1586-1589.
Kern D. J., et al., "Design of Reconfigurable Electromagnetic Bandgap Surfaces as Artificial Magnetic Conducting Ground Planes and Absorbers", Antennas and Propagation Society International Symposium 2006, IEEE Albuquerque, NM, USA Jul. 9-14, 2006, Piscataway, NJ, USA, IEEE, Piscataway, NJ, USA, Jul. 9, 2006, pp. 197-200.
From U.S. Appl. No. 13/441,730 (now U. S. Publication No. 2012-0256709 A1), Notice of Allowance mailed on Nov. 10, 2014.
From U.S. Appl. No. 13/441,730 (now U. S. Publication No. 2012-0256709 A1), Notice of Allowance mailed on Jul. 28, 2014.
From U.S. Appl. No. 13/441,730 (now U. S. Publication No. 2012-0256709 A1), Non-Final Office Action mailed on Mar. 13, 2014.
From U.S. Appl. No. 13/472,396 (now U. S. Publication No. 2013-0009722 A1), Non-Final Office Action mailed on Dec. 2, 2014.
From U.S. Appl. No. 13/472,396 (now U. S. Publication No. 2013-0009722 A1), Non-Final Office Action mailed on Jul. 30, 2014.
From U.S. Appl. No. 13/177,479 (now U. S. Publication No. 2013-0009720 A1), Non-Final Office Action mailed on Dec. 2, 2014.
From U.S. Appl. No. 13/177,479 (now U. S. Publication No. 2013-0009720 A1), Non-Final Office Action mailed on Jun. 4, 2014.
From U.S. Appl. No. 13/441,659 (now U. S. Publication No. 2012-0256811 A1), Notice of Allowance mailed on Oct. 30, 2014.
From U.S. Appl. No. 13/441,659 (now U. S. Publication No. 2012-0256811 A1), Final Office Action mailed on Jul. 1, 2014.
From U.S. Appl. No. 13/441,659 (now U. S. Publication No. 2012-0256811 A1), Non-Final Office Action mailed on Feb. 24, 2014.
From U.S. Appl. No. 14/188,264 (Application and Office Actions).
A. S. Adonin, K. o. Petrosjanc, I. V. Poljakov, "Monolith Optoelectronic Integrated Circuit With Built-In Photovoltaic Supply for Control and Monitoring," 1998 IEEE International Conference on Electronics, Circuits and Systems, vol. 2, pp. 529-531, (1998).
Gower, John, Optical Communications Systems, 2nd edition, Prentice Hall, 1993, pp. 40-46.
From U.S. Appl. No. 14/628,076 (Application and Office Actions).
From U.S. Appl. No. 14/335,737 (Application and Office Actions).
Chinese Office Action dated Dec. 2, 2014 from Chinese Patent Application No. 201280021746 with English summary.
International Search Report and Written Opinion for PCT/US2014/072233 mailed on Mar. 16, 2015.
U.S. Appl. No. 14/628,076, filed Feb. 20, 2015, Schaffner et al.
U.S. Appl. No. 14/335,737, filed Jul. 18, 2014, White et al.
From U.S. Appl. No. 13/910,039 (Unpublished, Non-Publication Requested), Non-Final Rejection mailed on Nov. 25, 2015.
From U.S. Appl. No. 14/335,737 (Unpublished, Non-Publication Requested), Non-Final Rejection mailed on Dec. 30, 2015.
From Chinese Patent Application No. 201280033448.2, PRC Office Action dated Nov. 17, 2015 with Brief English summary.

\* cited by examiner

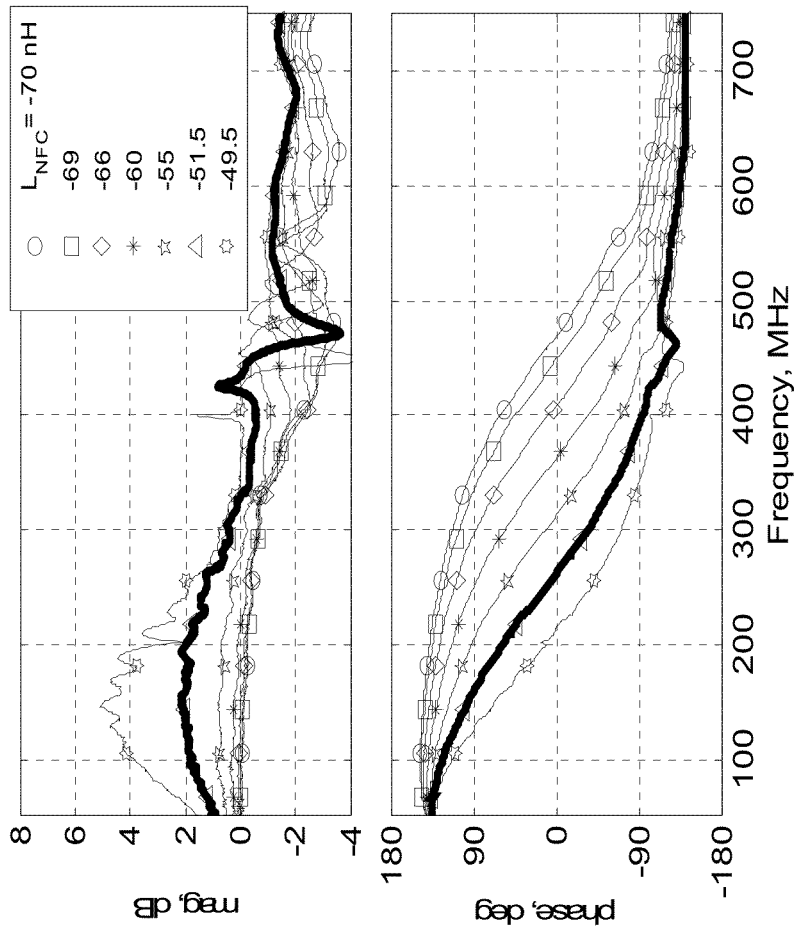
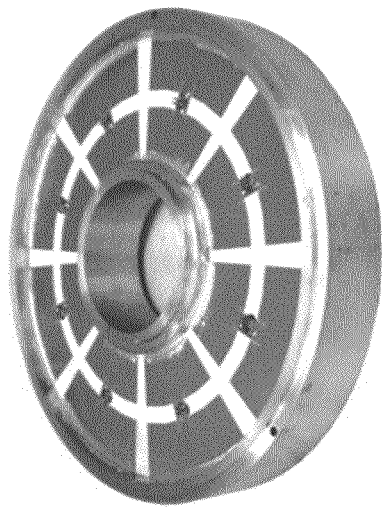
FIG. 5A PRIOR ART
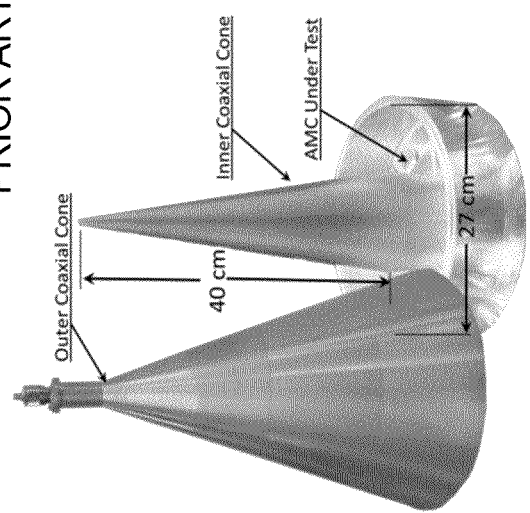
FIG. 5B PRIOR ART
FIG. 5C PRIOR ART

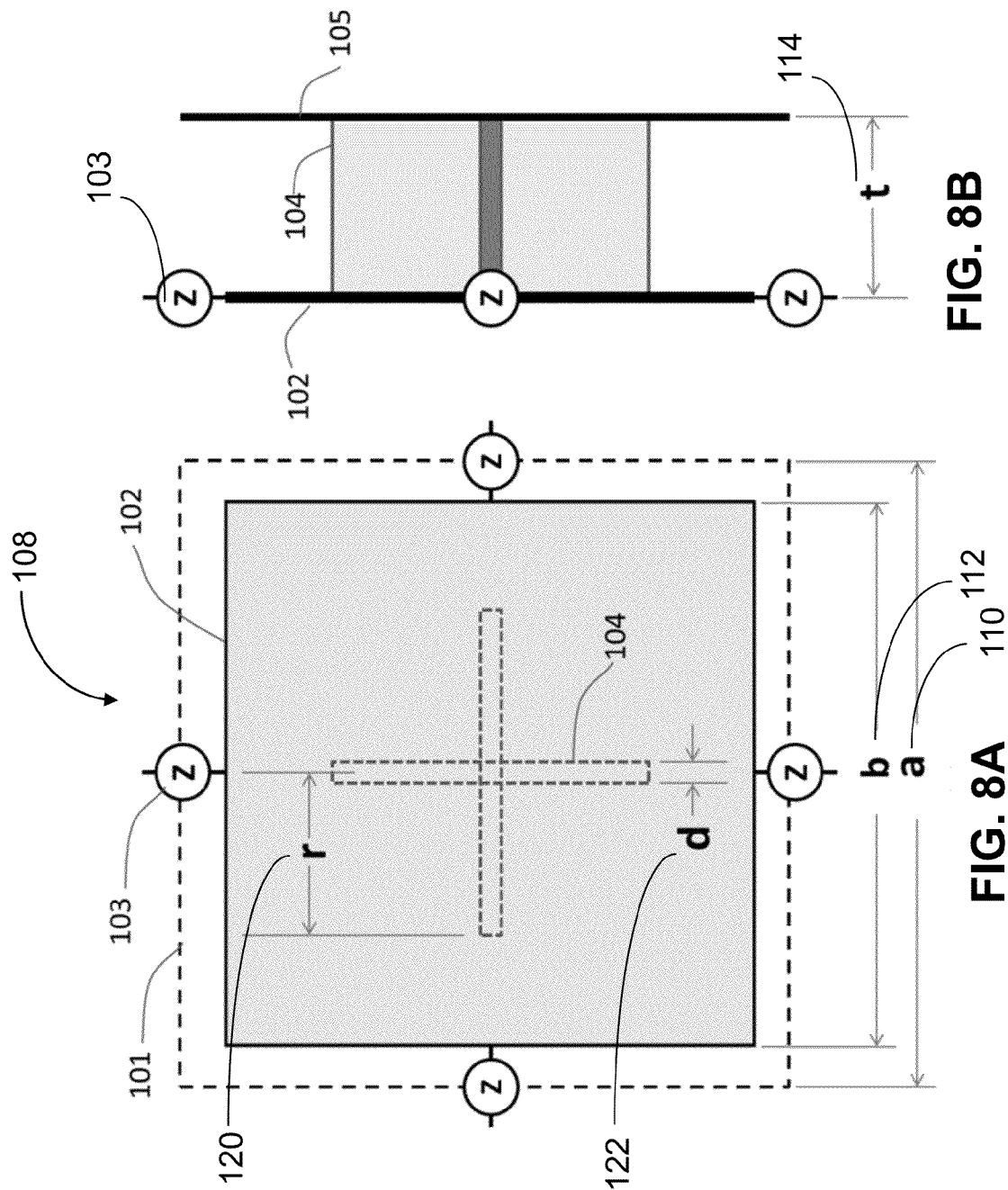

POLARIZATION INDEPENDENT ACTIVE ARTIFICIAL MAGNETIC CONDUCTOR

CROSS REFERENCE TO RELATED APPLICATIONS

This Application claims priority from and is related to U.S. patent application Ser. No. 14/188,264, filed Jun. 5, 2014 (Ladas & Parry 628844 4), and this Application is related to U.S. patent application Ser. No. 13/441,659, filed Apr. 6, 2012, which are incorporated herein as though set forth in full.

TECHNICAL FIELD

This disclosure relates to active artificial magnetic conductors (AAMCs).

BACKGROUND

It is often desirable to place antennas near and parallel to metallic surfaces, such as on an aircraft wing. However these surfaces reflect electromagnetic waves out of phase with the incident wave, thus short circuiting the antennas. While naturally occurring materials reflect electromagnetic waves out of phase, artificial magnetic conductors (AMCs) are metasurfaces that reflect incident electromagnetic waves in phase. AMCs are typically composed of unit cells that are less than a half wavelength and achieve their properties by resonance. Active circuits, for example negative inductors or non Foster circuits (NFCs), have been employed to increase the bandwidth, thus constituting an active AMC (AAMC). However, the use of negative inductors or non Foster circuits (NFCs), results in a conditionally stable AAMC that must be carefully designed to avoid oscillation.

AAMCs may improve antennas in a number of ways including 1) increasing antenna bandwidth, as described in references [6] and [11] below, 2) reducing finite ground plane edge effects for antennas mounted on structures to improve their radiation pattern, 3) reducing coupling between antenna elements spaced less than one wavelength apart on structures to mitigate co site interference, 4) enabling radiation of energy polarized parallel to and directed along structural metal surfaces, and 5) increase the bandwidth and efficiency of cavity backed slot antennas while reducing cavity size. Use of AAMC technology is particularly applicable for frequencies less than 1 GHz where the physical size of a traditional AMC becomes prohibitive for most practical applications.

An Artificial Magnetic Conductor (AMC) is a type of metamaterial that emulates a magnetic conductor over a limited bandwidth, as described in references [1] and [2] below. An AMC ground plane enables conformal antennas with currents flowing parallel to the surface because parallel image currents in the AMC ground plane enhance their sources. In the prior art, AMCs have been realized with laminated structures composed of a periodic grid of metallic patches distributed on a grounded dielectric layer, as described in references [1] and [3] below.

AMCs may have limited bandwidth. Their bandwidth is proportional to the substrate thickness and permeability, as described in references [1] to [4] below. At VHF UHF frequencies, the thickness and/or permeability necessary for a reasonable AMC bandwidth is excessively large for antenna ground plane applications.

The bandwidth limitation of an AMC may be overcome by using an active AMC (AAMC). An AAMC is loaded with non Foster circuit (NFC) negative inductors, as described in references [1], [5], and [6] below, and an AAMC may have an increased bandwidth of 10× or more compared to an AMC, as described in reference [1] below. When the AMC is loaded with an NFC, its negative inductance in parallel with the substrate inductance results in a much larger net inductance and hence, a much larger AMC bandwidth.

A prior art AAMC unit cell architecture is shown in FIG. 1. The AAMC has a ground plane 12, a 2.54 cm thick foam substrate 14, a 0.76 mm thick Rogers RO4003 board 16, copper patches 18, which are 65 mm thick, a 10 mm gap 20 between patches 18, a non Foster circuits (NFC) 22 between patches 18, a wiring access hole 24, and a via to ground 26.

An Artificial Magnetic Conductor (AMC) is characterized by its resonant frequency, $\omega_0$, which is where an incident wave is reflected with 0° phase shift, and by its ±90° bandwidth, which is defined as the frequency range where the reflected phase is within the range $|\phi_r|<90°$. An AMC response can be accurately modeled over a limited frequency range using an equivalent parallel LRC circuit with $L_{AMC}$, $C_{AMC}$, and $R_{AMC}$ as the circuits' inductance, capacitance and resistance respectively, as described in references [1] to [3] below. The circuit impedance is $$Z_{AMC} = \frac{j\omega L_{AMC}}{1 - \omega^2 L_{AMC} C_{AMC} + j\omega L_{AMC}/R_{AMC}}. \quad (1)$$

The resonant frequency and approximate fractional bandwidth [2] in the limit $\omega_0 L_{AMC} \ll Z_0$ are $$\omega_0 = \frac{1}{\sqrt{L_{AMC} C_{AMC}}}, \quad BW = \omega_0 L_{AMC}/Z_0, \quad (2)$$

where $Z_0$ is the incident wave impedance.

An AMC of the form shown in FIG. 1, where a grounded dielectric substrate is covered with a grid of metallic patches loaded with lumped elements between the patches can be approximated by a simple transmission line model, as described in references [1] and [3] below, which expresses the AMC admittance as the sum of the grid admittance $Y_g$, the load admittance $Y_{load}$, and the substrate admittance $Y_{sub}$ $$Y_{AMC} = Y_g + Y_{load} + Y_{sub}. \quad (3)$$

$$Y_{sub} = -j \cot(\sqrt{\epsilon\mu}\omega d)\sqrt{\epsilon/\mu}, \quad (4)$$

where d is the dielectric thickness, and $\epsilon$ and $\mu$ are the substrate's permittivity and permeability respectively. $Y_{sub}$ is expressed in terms of a frequency dependent inductance, $L_{sub} = -j/(\omega Y_{sub})$ which is approximately a constant $L_{sub} \approx \mu d$ for thin substrates with $\sqrt{\epsilon\mu}\omega d \ll 1$. The grid impedance of the metallic squares is capacitive, $Y_g = j\omega C_g$, and can be accurately estimated analytically, as described in references [2] and [7] below.

The loaded AMC reflection properties can be estimated by equating the LRC circuit parameters of equation (1) to quantities in the transmission line model of equations (3) and (4). If the load is capacitive, then the equivalent LRC circuit parameters are $$L_{AMC} = L_{sub}, \ C_{AMC} = C_g + C_{load} \text{ and } R_{AMC} = R_{load}. \quad (5)$$

If the load is inductive as it is in the AAMC of FIG. 1, then they are $$L_{AMC} = \frac{L_{Load}L_{sub}}{L_{Load} + L_{sub}}, C_{AMC} = C_g \text{ and } R_{AMC} = R_{load}. \quad (6)$$

An active AMC is created when the load inductance is negative, and $L_{AMC}$ increases according to equation (6). When $L_{load}<0$ and $|L_{load}|>L_{sub}>0$, then $L_{AMC}>L_{sub}$, resulting in an increase in the AMC bandwidth, and a decrease in the resonant frequency according to equation (2). When $L_{load}$ approaches $-L_{sub}$, then $L_{AMC}$ is maximized, the resonant frequency is minimized and the bandwidth is maximized. The bandwidth and resonant frequency are prevented from going to infinity and 0 respectively by loss and capacitance in the NFC and the AMC structure.

The AAMC is loaded with non Foster circuit (NFC) negative inductors, as described in references [1] and [6] below. The NFC is the critical element that enables realization of the AAMC and its high bandwidth. The NFC name alludes to the fact that it circumvents Foster's reactance theorem, as described in reference [8] below, with an active circuit. Details of an NFC circuit design and fabrication are given by White in reference [6] below.

FIG. 2A shows an NFC circuit 30 on a carrier board, which also has capacitors 32, RF (radio frequency) pads 34, and DC (direct current) pads 36. The NFC can be represented by the equivalent circuit model shown in FIG. 2B. In this model, $L_{NFC}$ is the desired negative inductance, $R_{NFC}$ is negative resistance. $C_{NFC}$ and $G_{NFC}$ are positive capacitance and conductance, respectively. In an ideal NFC, $R_{NFC}$, $C_{NFC}$ and $G_{NFC}$ are all equal to zero. $G_{NFC}=0$ is an open circuit.

The equivalent circuit parameters vary according to the bias voltage applied and some prior art NFC circuit parameters are plotted in FIG. 3.

NFCs become unstable when the bias voltage goes too high, when they are subjected to excessive RF power, or when they have detrimental coupling with neighboring NFCs. The instability is manifested as circuit oscillation and emission of radiation from the circuit. When the NFCs in an AAMC become unstable, the AAMC no longer operates as an AMC, and becomes useless. One consequence of this in the prior art, as described in reference [1] below, is that it has not been possible to create a dual polarization AAMC because of instability caused by coupling between neighboring NFCs.

Single polarization AAMCs have been demonstrated in the prior art, as described in references [1] and [9] below. Coupling between neighboring NFCs in the E plane, meaning between NFCs in neighboring rows, as shown in FIGS. 4A and 4B, causes the single polarization AAMC to be unstable. As shown in FIG. 4A, patch elements 40 with impedance loads 42 are each on a substrate 46 with a ground plane 48. In order to make the AAMC stable, RF isolation plates 44 must be installed between rows of patch elements 40 in the H plane. The isolation plates 44 span through the substrate 46 from the ground plane 48 to the patch elements 40. The AAMC operates for RF incident polarized perpendicular to the isolation plates 44. Incident radiation polarized along the other axis will be reflected as from a metal conductor because of its interaction with the isolation plates. NFCs next to each other in the H plane do not couple in an unstable manner.

Coaxial versions of the single polarization AAMC, as shown in FIG. 5A, have been constructed and measured. The coaxial version is convenient for measurement because it can be measured in a bench top setting using a coax transverse electromagnetic (TEM) cell, as shown in FIG. 5B, that provides direct real time measurements of AMC phase and amplitude vs. frequency, as described in reference [9] below. In the coax TEM cell, the coax AAMC appears to the incident wave in the coax as an infinite array of unit cells because of its azimuthal periodicity and the PEC boundaries on the radial walls. The fields are polarized radially, and neighboring NFCs do not couple unstably because their separation is perpendicular to the field polarization.

FIG. 5C shows measurements of the coax AAMC that confirm its operation as a stable wideband AMC. The NFC inductance is tuned from −70 to −49.5 nH. The phase and magnitude of a reflected wave vs. frequency is shown. In this AAMC, the resonant frequency can be tuned from approximately 470 MHz to 220 MHz while maintaining stability. When tuned to 263 MHz, as represented by the bold line in FIG. 5C, the ±90° bandwidth is more than 80%, spanning the range from 160 to 391 MHz. The prior art AAMC has much higher bandwidth than an equivalent passive AMC, as shown in FIG. 6. The AAMC has better than five times the bandwidth of a varactor loaded AMC at high loading levels.

REFERENCES

The following references are incorporated by reference as though set forth in full.

[1] Gregoire, D.; White, C.; Colburn, J.; "Wideband artificial magnetic conductors loaded with non Foster negative inductors," Antennas and Wireless Propagation Letters, IEEE, vol. 10, 1586 1589, 2011

[2] D. Sievenpiper, L. Zhang, R. Broas, N. Alexopolous, and E. Yablonovitch, "High impedance electromagnetic surfaces with a forbidden frequency band," IEEE Trans. Microwave Theory Tech., vol. 47, pp. 2059-2074, November 1999

[3] F. Costa, S. Genovesi, and A. Monorchio, "On the bandwidth of high impedance frequency selective surfaces", IEEE AWPL, vol. 8, pp. 1341 1344, 2009

[4] D. J. Kern, D. H. Werner and M. H. Wilhelm, "Active negative impedance loaded EBG structures for the realization of ultra wideband Artificial Magnetic Conductors," Proc. IEEE Ant. Prop. Int. Symp., vol. 2, 2003, pp. 427-430.

[5] U.S. patent application Ser. No. 13/441,659, filed Apr. 6, 2012.

[6] White, C. R.; May, J. W.; Colburn, J. S.; "A variable negative inductance integrated circuit at UHF frequencies," Microwave and Wireless Components Letters, IEEE, vol. 21, no. 12, 35 37, 2011

[7] O. Luukkonen et al, "Simple and accurate analytical model of planar grids and high impedance surfaces", IEEE Trans. Antennas Propagation, vol. 56, 1624, 2008

[8] R. M. Foster., "A reactance theorem", Bell Systems Technical Journal, vol. 3, pp. 259-267, 1924.

[9] Gregoire, D. J.; Colburn, J. S.; White, C. R.; "A coaxial TEM cell for direct measurement of UHF artificial magnetic conductors", IEEE Antenna and Propagation Magazine, 54, 251 250, 2012

[10] S. Stearns, "Non Foster circuits and stability theory," Proc. IEEE Ant. Prop. Int. Symp., 2011, pp. 1942-1945.

[11] S. E. Sussman Fort and R. M. Rudish, "Non Foster impedance matching of electrically small antennas," IEEE Trans. Antennas Propagation, vol. 57, no. 8, August 2009.

[12] C. R. White and G. M. Rebeiz, "A shallow varactor tuned cavity backed slot antenna with a 1.9:1 tuning range," IEEE Trans. Antennas Propagation, 58(3), 633-639, March 2010. Reference [12] describes a varactor tuned single polarized antenna, not a metasurface, and does not consider mutual coupling, active loading, or stability.

What is needed is a polarization independent active artificial magnetic conductor (AAMC). The embodiments of the present disclosure answer these and other needs.

SUMMARY

In a first embodiment disclosed herein, an active artificial magnetic conductor comprises a ground plane, an array of unit cells coupled to the ground plane, each unit cell comprising a low impedance shunt coupled to the ground plane, and an impedance element coupled to the low impedance shunt, and a plurality of non Foster circuits coupled in two different directions between impedance elements of adjacent neighboring unit cells in the array of unit cells.

In another embodiment disclosed herein, a method of making an active artificial magnetic conductor comprises forming an array of unit cells coupled to a ground plane, each unit cell comprising a low impedance shunt coupled to the ground plane, and an impedance element coupled to the low impedance shunt, and coupling a plurality of non Foster circuits in two different directions between impedance elements of adjacent neighboring unit cells in the array of unit cells.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 5A shows a single polarization coaxial AAMC, FIG. 5B shows a coaxial TEM cell used for measuring the coaxial AAMC of FIG. 5A, and FIG. 5C shows the reflection properties of a coaxial AAMC in accordance with the prior art;

FIGS. 8A and 8B show the top and side views of a unit cell of the active artificial magnetic conductor (AAMC) shown in FIG. 7 in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

An active artificial magnetic conductor (AAMC) that operates independent of radiation polarization is disclosed. Such a polarization independent AAMC may be called a dual polarization AAMC or a dual polarity AAMC.

Figure 7:
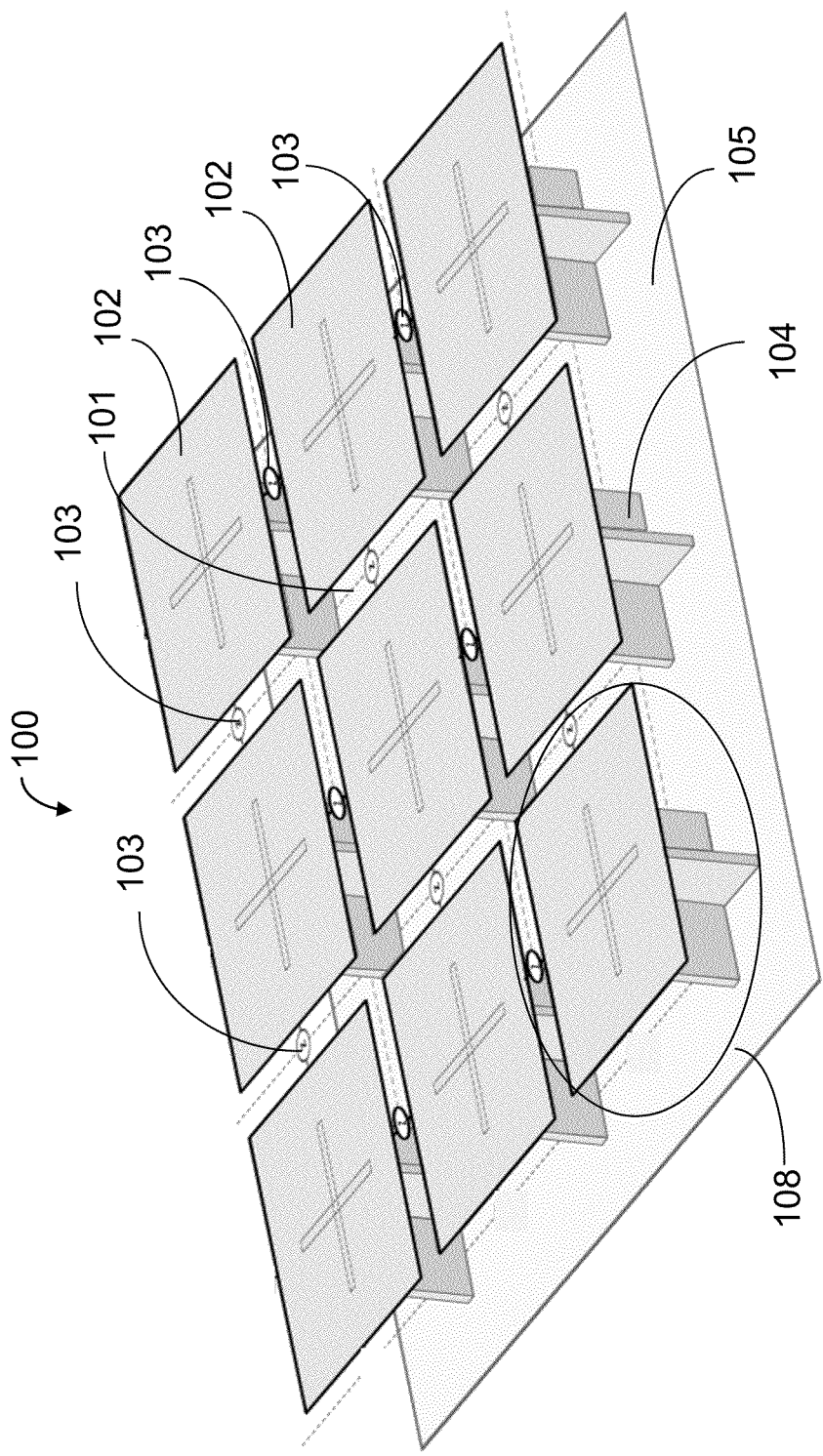
FIG. 7 shows an active artificial magnetic conductor (AAMC) in accordance with the present disclosure.

FIG. 7 shows a perspective view of a schematic of a dual polarization AAMC structure 100 in accordance with the present disclosure. The AAMC structure 100 has a finite array of impedance elements 102 displaced from a ground plane 105 by low inductance shunts 104. The low inductance shunts 104 are electrically connected between an impedance element 102 and the ground plane 105. Non Foster circuits (NFC) 103, which may be negative inductors, are connected between neighboring impedance elements 102 in two independent directions, which may be characterized as the horizontal and vertical directions, for example. The two independent direction need to be different directions; however they do not need to be orthogonal. The impedance elements 102 are typically metallic patches, and are shown as square in FIG. 7; however, the impedance elements 102 may have any shape and any aspect ratio. For example, an impedance element may be a square or a rectangular patch with a diagonal slit or gap. If the slit is in the middle and cuts the patch in two, then the impedance element is actually two patches separated by the slit.

Figure 1:
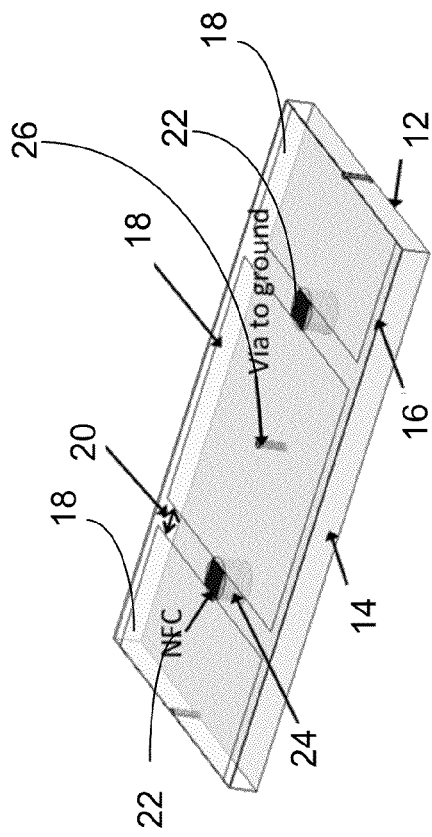
FIG. 1 shows an active artificial magnetic conductor (AAMC) on a carrier board in accordance with the prior art.
Figure 2B:
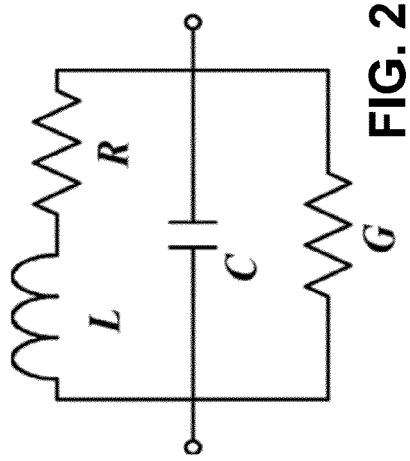
FIG. 2B shows an equivalent circuit for a non Foster circuit (NFC) in accordance with the prior art.
Figure 2A:
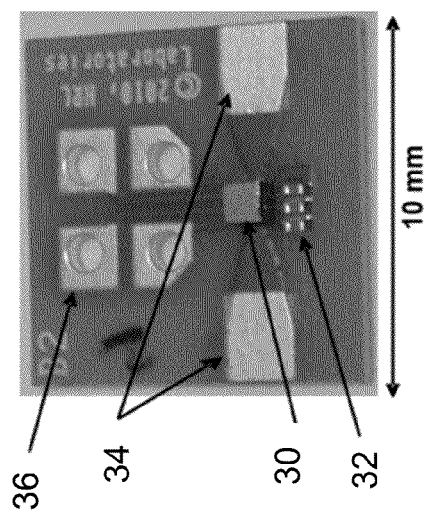
FIG. 2A shows a non Foster circuit (NFC) on an active artificial magnetic conductor carrier board in accordance with the prior art.
Figure 3:
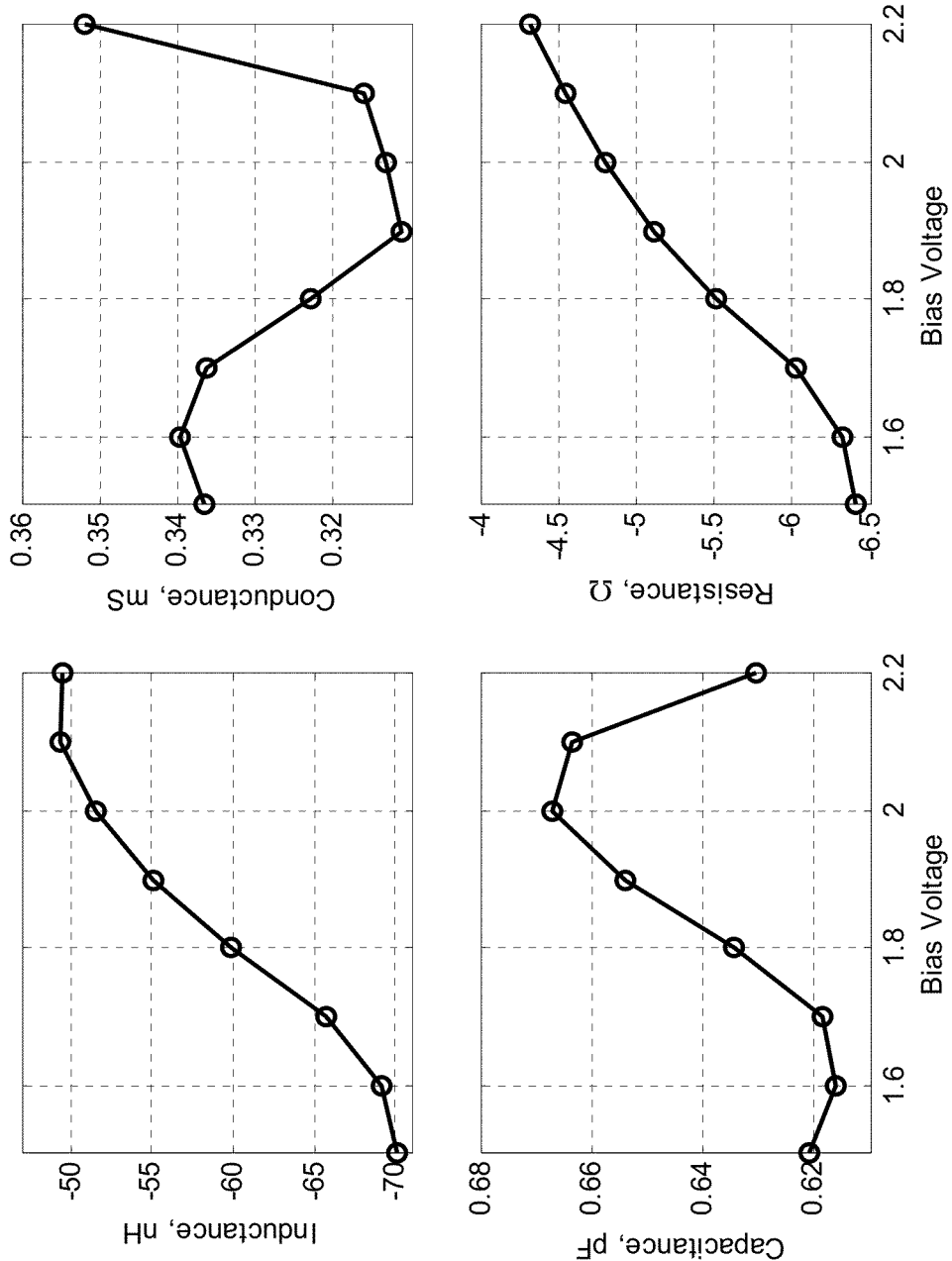
FIG. 3 shows circuit parameters of a prior art non Foster circuit in accordance with the prior art.
Figures 4A, 4B:
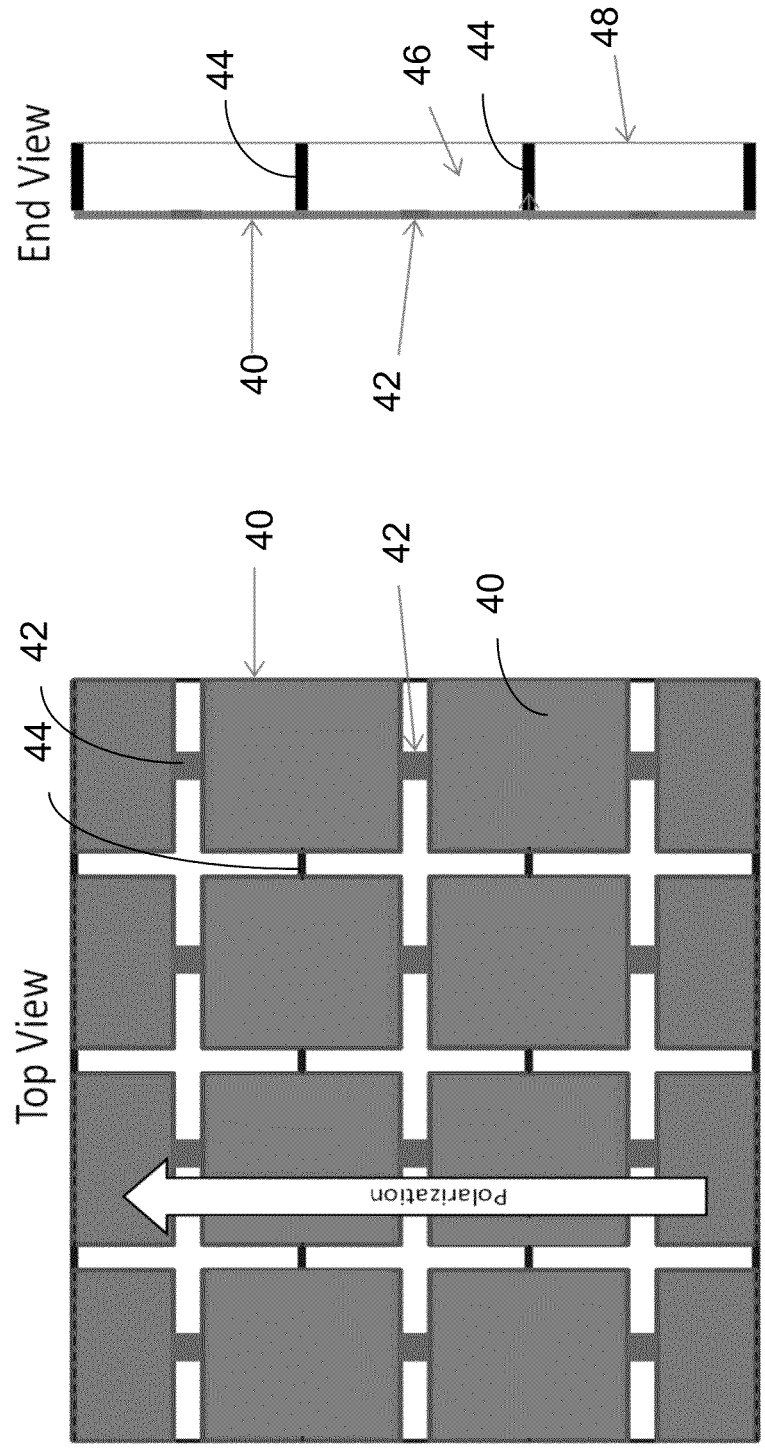
FIGS. 4A and 4B show a single polarization AAMC in accordance with the prior art.
Figure 6:
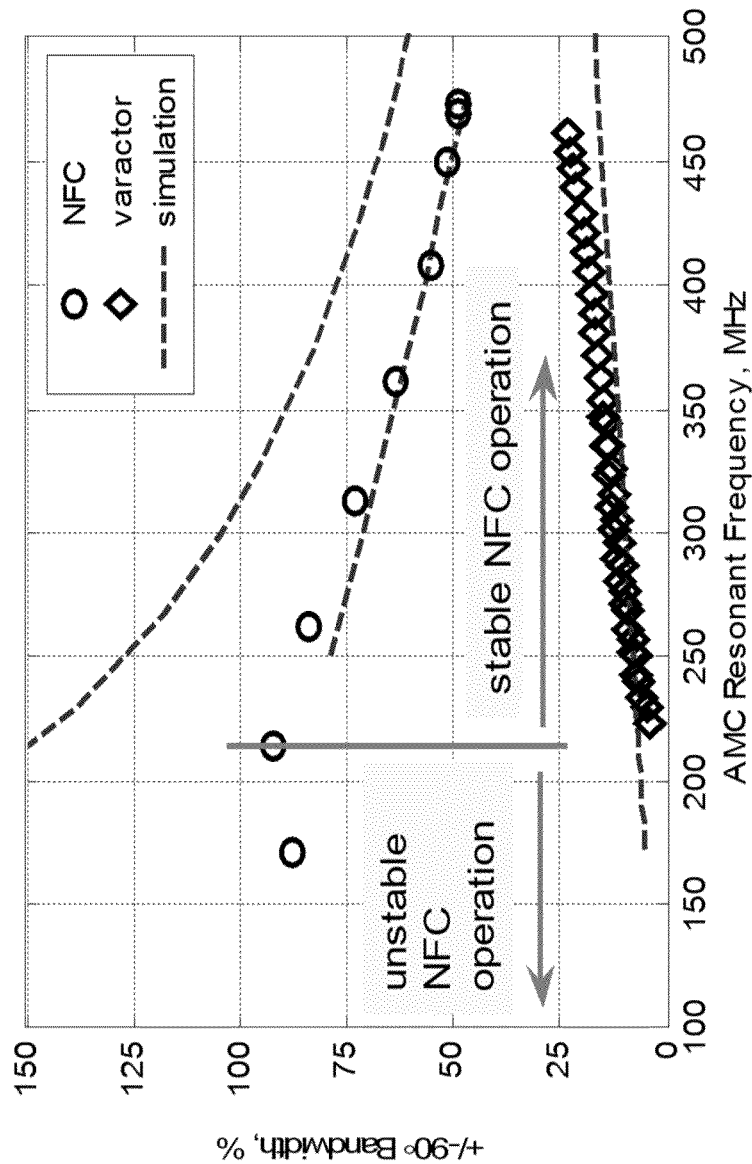
FIG. 6 shows ±90° bandwidth for an AAMC and for a varactor loaded passive AMC in accordance with the prior art.

Similar to the prior art AAMC of FIGS. 4A and 4B, the impedance elements 102 may be attached to a dielectric substrate between the impedance elements and the ground plane 105.

FIGS. 8A and 8B show the top and side views of a unit cell 108 of the AAMC structure 100 shown in FIG. 7. In this embodiment, the low impedance shunt 104 has a cross shaped cross section with a half width r 120 or a full width of 2r. Each of the cross shaped sections has a thickness d 122. The unit cell 101 size has an overall dimension of a 110. The impedance element 102 may be a square metallic patch with each side having a dimension b 112. The low impedance shunt 104 has a height dimension of t 114, so the impedance elements 102 are separated from the ground plane 105 by a distance t 114. Non Foster circuits (NFCs) 103 connect each of the four sides of each impedance element 102 to a side of a neighboring impedance element 102, unless the impedance element is located on an edge or corner of the AAMC structure 100, in which case the impedance element 102 is connected on three sides or two sides, respectively, to a neighboring impedance element 102, as shown in FIG. 7.

Figures 9A, 9B:
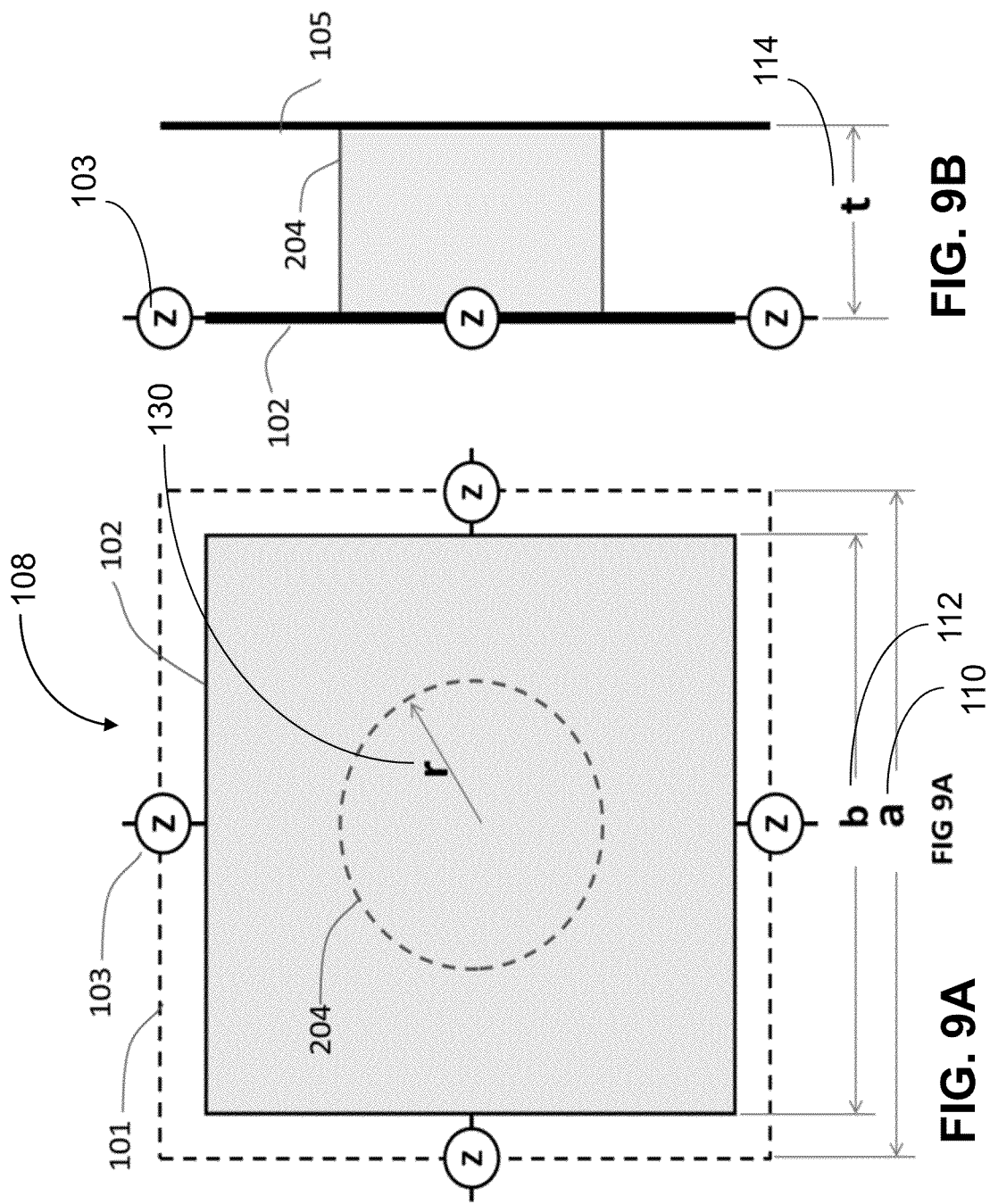
FIGS. 9A and 9B show top and side views of a unit cell for another embodiment of the active artificial magnetic conductor (AAMC) shown in FIG. 7 where the low inductance shunts are round vias of radius r in accordance with the present disclosure.

FIGS. 9A and 9B shows top and side views of another embodiment of the unit cell 108 where the low inductance shunts 204 between the impedance elements 102 and the ground plane 105 are round vias of radius r 130, rather than being cross shaped cross section low impedance shunts 104.

The low inductance shunts are not limited to the shapes shown in FIGS. 8A and 9A, and in general may be any shape.

The dual polarization AAMC 100, as shown in FIG. 7, is somewhat similar to the prior art single polarity AAMC discussed above with reference to FIG. 4, but has at least the following structural differences: (1) no RF isolation plates are needed between neighboring rows of impedance elements; (2) non Foster circuit (NFC) elements 103 are electrically connected between the impedance elements 102 in the horizontal as well as in the vertical directions; and (3) the low inductance shunt vias (104, as shown in FIGS. 7 and 8A and 8B, or 204, as shown in FIGS. 9A and 9B) are between each impedance element 102 and a ground plane 105.

The low inductance of the shunt vias (104 or 204) enables the dual polarization AAMC to be stable by minimizing the mutual coupling between impedance elements.

The stability of finite AAMCs may be approximated using Eigen analysis, which is well known to those skilled in the art. At frequencies well below resonance, the admittance matrix may be approximated by self and mutual inductances:

$$Y \approx \frac{1}{s}\begin{pmatrix} 1/L_{11} & \cdots & 1/L_{1N} \\ \vdots & \ddots & \vdots \\ 1/L_{N1} & \cdots & 1/L_{NN} \end{pmatrix} \quad (7)$$

where N is the number of Non Foster circuits 103 and $s=j2\pi f$ is the complex radian frequency of the Laplace transform. In FIG. 7 the array of impedance elements 102 is a 3×3 array, and the number N of NFCs 103 is 12. The array of impedance elements 102 may be any size. The admittance matrix can be simplified to 1/s times an inductance matrix where the eigenvalues of the inductance matrix quantify an equivalent inductance for a given eigenmode. Assuming all NFCs 103 are identical with inductance $L_{NFC}<0$, the total inductance is the parallel combination of the eigenvalue $L_{eq}$ and $L_{NFC}$, and the network is stable if $L_{NFC}<L_{eq}$ for all eigenvalues. This method may be extended to all frequencies by performing a Nyquist analysis on the frequency domain admittance matrix and NFC admittance model.

The size and cross sectional area of the low inductance shunts (104 and 204) determines their inductance. The lower the inductance, the greater the stability range for the dual polarization AAMC 100. However, as a shunt (104 204) gets larger thus reducing its inductance, the AAMC's frequency range is reduced. Thus, there is a tradeoff between frequency operation range and stability that must be considered.

Analysis of a 5×5 unit cell array of the geometry of FIG. 7 with a=75 mm, b=65 mm, r=18.75 mm, d=3 mm, t=25 mm, and with $L_{NFC}$ varying from 45 to 32 nH predicts that the AAMC is stable for $L_{NFC}<36$ nH, which implies that stable tuning from 1200 MHz to 500 MHz is achievable with the ±90° bandwidth ranging from 50% to 96% respectively.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. An active artificial magnetic conductor comprising:
   a ground plane;
   an array of unit cells coupled to the ground plane, each unit cell comprising:
      a low-impedance shunt coupled to the ground plane; and
      an impedance element coupled to the low impedance shunt; and
   a plurality of non-Foster circuits coupled in two different directions between impedance elements of adjacent neighboring unit cells in the array of unit cells;
   wherein the low impedance shunts coupled to the ground plane in each unit cell have a low inductance; and
   wherein an inductance of the low inductance of the low-impedance shunts is such that the mutual coupling between impedance elements is minimized thereby making the active artificial magnetic conductor stable.

2. The active artificial magnetic conductor of claim 1 wherein the low impedance shunt has a cross-shaped cross section.

3. The active artificial magnetic conductor of claim 1 wherein the low impedance shunt has a circular cross section.

4. The active artificial magnetic conductor of claim 1 wherein the impedance element is metallic.

5. The active artificial magnetic conductor of claim 1 wherein the impedance element is rectangular or square.

6. The active artificial magnetic conductor of claim 5 wherein each non-Foster circuit is coupled to a side of the impedance element.

7. The active artificial magnetic conductor of claim 1 wherein the non-Foster circuit has a negative inductance.

8. The active artificial magnetic conductor of claim 1 wherein:
   the array of unit cells are arranged in horizontal and vertical directions; and
   the two different directions are the horizontal and vertical directions.

9. The active artificial magnetic conductor of claim 1 wherein:
   each low-impedance shunt has a cross-shaped cross section with a half-width r or a full width of 2r;
   each of the cross shaped sections has a thickness d;
   each unit cell is an square of size a by a;
   each impedance element is a square of size b by b; and
   each low-impedance shunt has a height of t from the ground plane;
   wherein a is greater than b and 2r is less than b.

10. The active artificial magnetic conductor of claim 9 wherein:
    the array of unit cell comprises a 5×5 unit cell array;
    a equals 75 mm;
    b equals 65 mm;
    r equals 18.75 mm;
    d equals 3 mm;

t equals 25 mm; and an inductance $L_{NFC}$ of each non-Foster circuit ranges from varying from −45 nH to −36 nH;

wherein the active artificial magnetic conductor is stable from 1200 MHz to 500 MHz with a ±90° bandwidth ranging from 50% to 96%.

11. The active artificial magnetic conductor of claim 1 wherein at frequencies below a resonant frequency self and mutual inductances of unit cells of the array of unit cells are approximated by an admittance matrix $$Y \approx \frac{1}{s}\begin{pmatrix} 1/L_{11} & \cdots & 1/L_{1N} \\ \vdots & \ddots & \vdots \\ 1/L_{N1} & \cdots & 1/L_{NN} \end{pmatrix};$$

where N is a number of the plurality of non-Foster circuits and $s=j2\pi f$ is a complex radian frequency of a Laplace transform, $L_{NN}$ for N=1 to N are self inductances of the unit cells, and $L_{JM}$ for J=1 to N, M=1 to N, and J not equal to M are mutual inductances of the unit cells.

12. The active artificial magnetic conductor of claim 1 wherein the ground plane is metallic.

13. The active artificial magnetic conductor of claim 1 further comprising:
 a dielectric substrate;
 wherein the dielectric substrate is between the impedance elements and the ground plane.

14. The active artificial magnetic conductor of claim 1 wherein an inductance $L_{NFC}$ of each non-Foster circuit is less than −36 nH.

15. A method of making an active artificial magnetic conductor comprising:
 forming an array of unit cells coupled to a ground plane, each unit cell comprising:
  a low-impedance shunt coupled to the ground plane; and
  an impedance element coupled to the low impedance shunt; and
 coupling a plurality of non-Foster circuits in two different directions between impedance elements of adjacent neighboring unit cells in the array of unit cells;
 wherein the low impedance shunts coupled to the ground plane in each unit cell have a low inductance; and
 wherein an inductance of the low inductance of the low-impedance shunts is such that the mutual coupling between impedance elements is minimized thereby making the active artificial magnetic conductor stable.

16. The method of claim 15 wherein the low impedance shunt has a cross-shaped cross section.

17. The method of claim 15 wherein the low impedance shunt has a circular cross section.

18. The method of claim 15 wherein the impedance element is rectangular or square.

19. The method of claim 18 wherein each non-Foster circuit is coupled to a side of the impedance element.

20. The method of claim 15 wherein:
 the array of unit cells are arranged in horizontal and vertical directions; and
 the two different directions are the horizontal and vertical directions.

21. The method of claim 15 wherein at frequencies below a resonant frequency self and mutual inductances of unit cells of the array of unit cells are approximated by an admittance matrix $$Y \approx \frac{1}{s}\begin{pmatrix} 1/L_{11} & \cdots & 1/L_{1N} \\ \vdots & \ddots & \vdots \\ 1/L_{N1} & \cdots & 1/L_{NN} \end{pmatrix};$$

where N is a number of the plurality of non-Foster circuits and $s=j2\pi f$ is a complex radian frequency of a Laplace transform, $L_{NN}$ for N=1 to N are self inductances of the unit cells, and $L_{JM}$ for J=1 to N, M=1 to N, and J not equal to M are mutual inductances of the unit cells.

22. The method of claim 15 further comprising:
 providing a dielectric substrate between the impedance elements and the ground plane.

23. The method of claim 15 wherein an inductance $L_{NFC}$ of each non-Foster circuit is less than −36 nH.

\* \* \* \* \*